US006992331B2

(12) United States Patent
Hon et al.

(10) Patent No.: US 6,992,331 B2
(45) Date of Patent: Jan. 31, 2006

(54) GALLIUM NITRIDE BASED COMPOUND SEMICONDUCTOR LIGHT-EMITTING DEVICE

(75) Inventors: Schang-Jing Hon, Pa Te (TW); Jenn-Bin Huang, Tai Chung Hsien (TW); Nai-Guann Yih, Tao Yuan Hsien (TW)

(73) Assignee: Supernova Optoelectronics Corp., Taipei (TW)

( * ) Notice: Subject to any disclaimer, the term of this patent is extended or adjusted under 35 U.S.C. 154(b) by 127 days.

(21) Appl. No.: 10/700,536

(22) Filed: Nov. 5, 2003

(65) Prior Publication Data

US 2004/0089868 A1 May 13, 2004

(30) Foreign Application Priority Data

Nov. 6, 2002 (TW) .............................. 91132695 A

(51) Int. Cl.
*H01L 27/15* (2006.01)

(52) U.S. Cl. .......................... 257/79; 257/94; 257/102

(58) Field of Classification Search ................. 257/79, 257/94, 102, 103
See application file for complete search history.

(56) References Cited

U.S. PATENT DOCUMENTS

2002/0058351 A1 * 5/2002 Iwata et al. .................. 438/46
2003/0077847 A1 * 4/2003 Yoo ........................... 438/22
2003/0122147 A1 * 7/2003 Sheu ......................... 257/103

* cited by examiner

*Primary Examiner*—Tuan H. Nguyen
(74) *Attorney, Agent, or Firm*—Troxell Law Office, PLLC

(57) ABSTRACT

Disclosed are a GaN based compound semiconductor light emitting diode (LED) and a manufacturing method therefor. In the LED, a combination of a light extraction layer and an adaptive layer is formed over a multi-layer epitaxial structure,wherein the light extraction layer is a light transmissible impurity doped metal oxide and the adaptive layer is a Ni/Au layer used to enhance ohmic contact between the light extraction layer and the multi-layer epitaxial structure.

12 Claims, 10 Drawing Sheets

GALLIUM NITRIDE BASED COMPOUND SEMICONDUCTOR LIGHT-EMITTING DEVICE

BACKGROUND OF THE INVENTION

1. Field of the Invention

The present invention relates to a GaN based compound semiconductor light-emitting device (LED) and a manufacturing method therefor, and particularly to a GaN based compound semiconductor light-emitting device (LED) with better light transparency and a manufacturing method therefor.

2. Description og Related Art

A light-emitting device (LFES) has been generally known as a device with ability to light generating, which has been widely used in digital watches, calculators, communications and other areas, such as mobile phone and some appliances. Recently, the efforts and attempts have shifted to use LEDs in more ordinary human living, such as large panels, traffic lights and lighting facilities. However, in marching into a brand new era replacing the current lighting facilities with LEDs, the luminous efficiency of an LED is still a significant issue, which has been challenging those skilled in the art for many years. Therefore, many developments and researches have been thrown in to improvement of luminous efficiency of LEDs, and red, green, blue and white colored lights are alike.

As is well understood to those skilled in the art, LEDs are produced based on some semiconductor materials, especially GaN-based compound semiconductor, and emits lights by virtue of the behaviors featured in the semiconductor materials in the presence of an applied electrical bias.

In particular, an LED is generally composed of some III–V group (or II–VI group, although rarely given forth) compound semiconductors accounting for their stronger inclination of recombination of electrons and holes. In principle, an LED is basically a well-known p-n junction structured device, i.e., a device having a p region, an n region and a depletion region therebetween. With a forward voltage or current bias applied, the majority of the carriers in the p or n regions drift respectively towards the other region through the depletion region in the device due to the energy equilibrium principle and a current is accounted for, in addition to the general thermal effects. When some electrons and holes in the device jumped into a higher value of energy band with the aid of electrical and thermal energy, the electrons and the holes recombine there and then give off lights when they randomly fall back to a lower energy state (turning from al unsteady state to a steady state) owing to thermal equilibrium principle, i.e. spontaneous emission. Besides the p-n junction, in a typical and basic such device stricture there are also other components, such as a substrate, a buffer layer, a transparent contact layer (TCL) and electrodes. In achieving a high luminous efficiency LED, each component and their mutual relationship in the device structure are generally considered.

In a typical LED, a TCL is a layer coated on the LED structure and below a p-type electrode. Since the p-type electrode is normally not transparent and will have blockage on the emitted light to a user's eyes, the p-type electrode should be sized and disposed at a limited portion on the underlying layer contact therewith. However, the electrical force lines resulted from between the p-type electrode and an n-type electrode may not uniformly distribute in the p-n structure in the device. Hence, the electrical charges provided by the applied electrical bias may not efficiently stimulate the p-n structure, which is necessary for light generation. Further, the p-type electrode is inhered with poor mobility as compared to that of the n-type electrode and thus the stimulation efficiency of the electric bias on the device may not be satisfactory. A thin TCL is in this occasion coated over the toppest layer (in fact, under the p-type electrode). The TCL is a transparent material to a light generated from the device and equipped with ability of electricity conduction. Once an electric bias is fed from the p-type electrode, the corresponding charges will spread uniformly in the p-n structure with an aid of the TCL underlying the p-type electrode and the poor stimulation efficiency of the electric bias may be overcome.

Ni/Au material is widely used as the TCL in a GaN based light-emitting device in achieving an improved light-emitting device. However, Ni/Au is not a material with satisfactory light transparency and should thus be made considerably thin, about 0.005–0.2 μm. However, according to the critical angle theory, a TCL should possess a suitable thickness and will then facilitate extraction of the generated light out of the device. Therefore, Ni/Au material may not be the most appropriate choice as a TCL for an LED in light transparency and extraction efficiency's view owing to the thickness issue. Further, since such GaN based light emitting device with Ni/Au as the TCL may not be formed with more facets by use of surface treatment under the limitation of 0.005–0.2 μm of thickness of the Ni/Au layer, the light extraction efficiency stands little possibility to be promoted in terms of the Ni/Au layer.

In view of the foregoing problems, it is needed to set forth a GaN based compound semiconductor LED that may really provide an improved TCL. To this end, the inventors of the present invention provide herein a GaN based compound semiconductor LED with a TCL other than Ni/Au. To further enhance the function the TCL may provide, a suitable adaptive layer for the TCL is provided in the LED structure whereby the entire device may achieve better light transparency and extraction efficiency. Thus, the combination of the TCL and its adaptive layer may well replace the currently used Ni/Au TCL.

SUMMARY OF THE INVENTION

It is therefore an object of the present invention to provide a GaN based compound semiconductor light emitting device (LED) and a corresponding manufacturing method, which has a better transparent contact layer (TCL) and an adaptive layer for the TCL, wherein the TCL may be made bulky and facet-rich and the adaptive layer may enhance the TCL's contact characteristic with the underlying layer of the LED. The thus produced LED may achieve higher light extraction efficiency.

To achieve the object of the present invention, a doped metal oxide is used as the TCL of the LED. In a preferred embodiment, the doped metal oxide may be a doped ZnO based layer, the-state-of-the-art Ni/Au material is otherwise used as a good ohmic contact layer for the TCL in the LED structure.

In the inventive LED structure, the constituent materials, from bottom to top, comprise: a substrate, a multi-layer epitaxial structure, an ohmic contact layer, a light extraction layer, an n-type electrode and a p-type electrode. In the multi-layer epitaxial structure, there include a buffer layer, a first semiconductor layer, a light generating layer and a second semiconductor layer.

A manufacturing method for the inventive LED comprises the steps of: (a) forming an n-GaN based layer over a substrate; (b) forming a multi-quantum well (MQW) active layer over the n-GaN based layer; (c) forming a p-GaN based layer over the MQW layer and etching away a portion of the n-GaN layer, the MQW active layer and the p-GaN layer, whereby an exposing layer is formed on the n-GaN layer; (d) forming a Ni/Au ohmic contact layer over the p-GaN based layer; (e) forming a doped metal oxide layer as a light extraction layer over the Ni/Au ohmic contact layer; (t) subjecting the light extraction layer to a surface treatment; and (g) forming an n-type electrode over all exposing region after the etching of the n-GaN based layer and forming a p-type electrode over the light extraction layer. In a preferred embodiment, the doped metal oxide light extraction layer is a doped ZuO based layer.

In an LED, the inventive TCL has better performance in light transparency as compared to Ni/Au owing to its large bandgap. Aid the poorer conductivity of the inventive TCL may be compensated with the Ni/Au material. Further, since the doped metal oxide TCL may be made bulky, the TCL may be treated to have more facets to increase light extraction, which is contrasted to the currently used Ni/Au TCL. Hence, the inventive doped metal oxide TCL and the corresponding adaptive layer, Ni/Au, may achieve a good combination as a TCL, superior to the current Ni/Au layer for the p-type electrode of the LED, i.e., the inventive combination may provide both good light transparency and ohmic contact characteristics.

BRIEF DESCRIPTION OF THE DRAWINGS

To better understand the other features, technical concepts and objects of the present invention, one may clearly read the description of the following preferred embodiments and the accompanying drawings, in which.

DETAILED DESCRIPTION OF PREFERRED EMBODIMENTS

Figure 1:
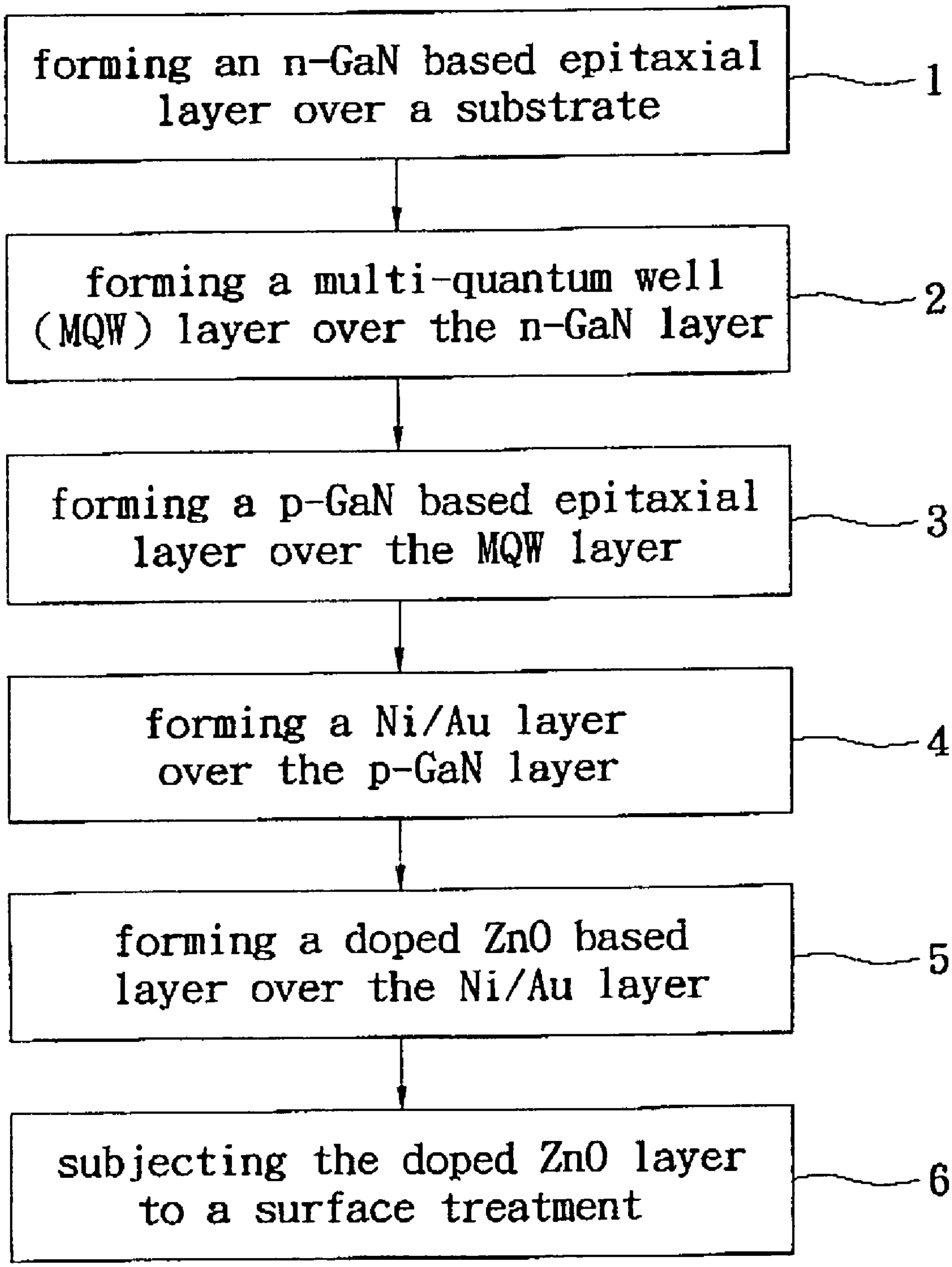
FIG. 1 depicts schematically a manufacturing method of a preferred embodiment according to the present invention.
Figure 2:
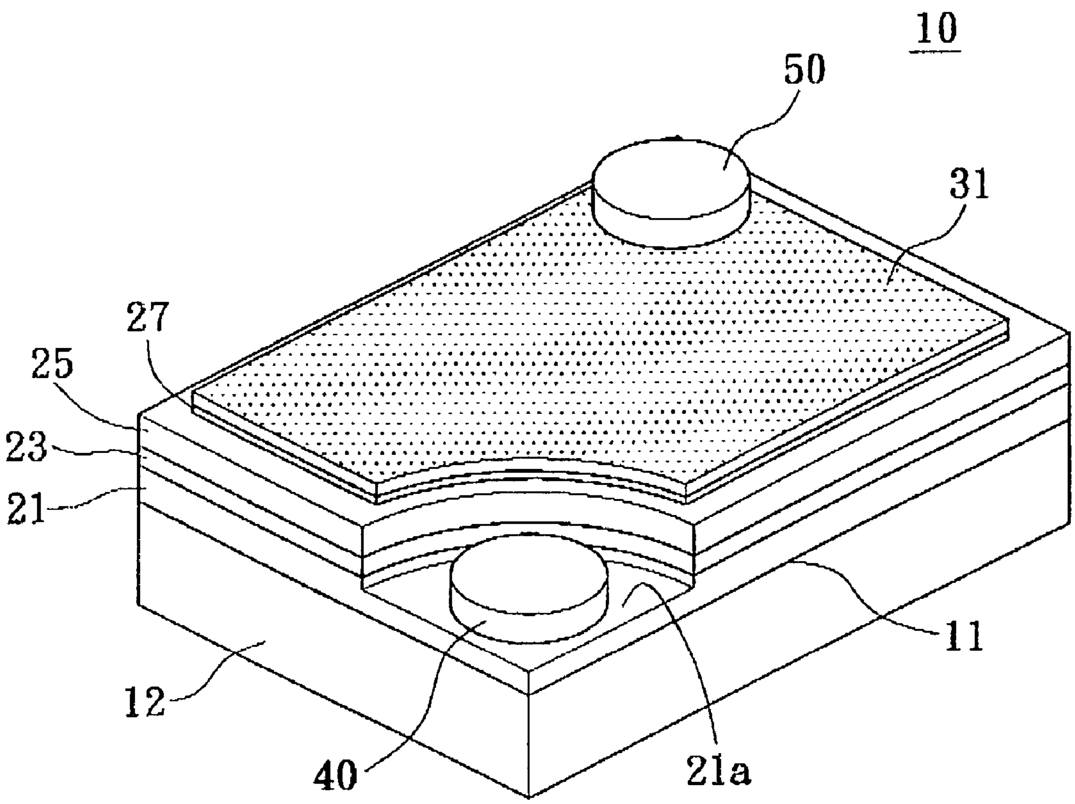
FIG. 2 is a schematically perspective diagram of a light-emitting device of a preferred embodiment according to the present invention.
Figure 3:
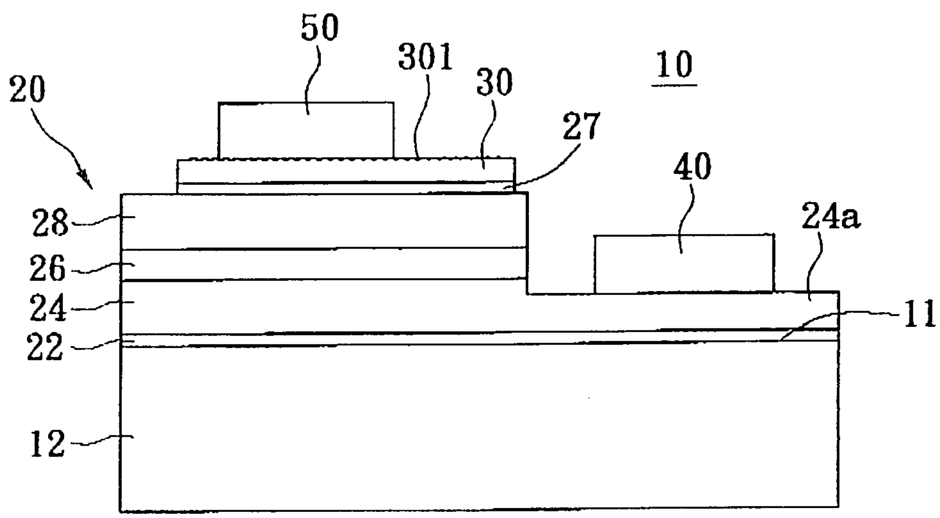
FIG. 3 depicts schematically a structure of a light-emitting device of a preferred embodiment according to the present invention.

Referring to FIGS. 1 through 3 illustrating a preferred (first) embodiment of an LED of the present invention, which show a device and the corresponding method of the LED. In the LED, a doped ZnO based layer and a Ni/Au adaptive layer for the doped ZnO based layer as an ohmic contact layer are included over a multi-layer epitaxial structure of the L)ED. The thus formed combination of the doped ZnO based layer and the Ni/Au layer provides good light transparency and ohmic contact characteristics. Specifically, the method of the preferred embodiment is described in FIG. 1 and each step thereof will be recited accompanying with the associated element labels, which are also shown in the corresponding device illustration in FIGS. 2 and 3.

Step 1: forming an n-GaN based epitaxial layer 21 over a substrate 12. The substrate 12 may at least be sapphire or SiC and have a thickness of 300–450 μm, The substrate 12 may be first formed with a buffer layer 22 at an upper surface 11 thereof, and then formed over with the n-GaN based epitaxial layer 21 having a thickness of 2–6 μm. The buffer layer may be composed of some layers, such as a coarse grain nucleation layer made of GaN and an undoped GaN layer. The nucleation layer is a low temperature layer, i.e. formed under a low temperature condition, and has a thickness of 30–500 Å and will be referred to as an LT-GaN layer herein. The undoped GaN is a high temperature layer and has a thickness of 0.5–6 μm, and will be termed as an HT-GaN layer here. These buffer layers may be formed by molecular beam epitaxy (MBE), metal organic chemical vapor deposition (MOCVD) and some other suitable technologies, currently in existence or set forth in the future.

Step 2: forming a multi-quantum well (MQW) active layer 23 over the n-GaN based layer 21. As generally known, an MQW layer is a multi-layered structure and used to enhance possibility of recombination of the holes and electrons in the p-and-n junction structure of the LED. In the present invention, the thicickness and layer number of the MQW layer 23 are chosen so that the MQW layer 23 may efficiently increase light generating efficiency.

Step 3: forming a p-GaN based epitaxial layer 25 over the MQW active layer 23 and etching away a portion of the n-GaN based layer 21, the MQW active layer 23 and the p-GaN based layer 25 whereby an exposing region **21*a* is formed on the n-GaN based layer 21, wherein the p-GaN based epitaxial layer 25** may be such as p-GaN, p-InGaN and p-AlInGaN layers and have a thickness of 0.2–0.5 μm. It is noted that the etching may be performed with chlorine plasma dry etching, etc.

Step 4: forming a Ni/Au layer 27 over the p-GaN layer. The Ni/Au layer 27 is composed of an underlying Ni layer and an Au layer thereon. This layer 27 may not be formed thick owing to the afro-mentioned reason and the appropriate thickness thereof is 0.005 to 0.2 μm. As for the process conditions, they have been familiar to those persons skilled in the art, and will be omitted here. The technology for formation of this layer 27 may be any suitable technology.

Step 5: forming a doped ZnO based layer 31 over the Ni/Au layer 27 after said etching operation. Since the layer 31 is provided at the toppest of the LED device 10 for light exiting excepted for a p-electrode 50, the layer is also termed as a window layer. In forming the doped ZnO based metal oxide layer, either of self-texturing by sputtering, physical vapor deposition, ion plating, pulsed laser evaporation chemical vapor deposition and molecular beam epitaxy and other suitable technologies may be utilized. The thickness of this doped ZnO based layer 31 may be ranged between 50 Å and 50 μm. In this case, the Ni/Au layer 27 is served as an ohmic contact layer for the doped ZnO based layer 31. Preferably, the thickness of the doped ZnO based layer 31 is made larger than 1 μm, and the reason will be given in the following related to the LED device 10.

Step 6: subjecting the doped ZnO based layer 31 to a surface treatment, wherein the doped ZnO based layer 31 is at least 1 μm thick. Owing to the sufficient thickness of the doped ZnO based layer 31, it may be applied with a surface treatment to posses a roughened surface or particularly textured surface so as to increase extraction of the generated light from the device 10, which will be described in more detail in the following.

The above steps may form a basic LED device structure. To enable actual usability, forming the p-type electrode 50 over the doped ZnO based layer 31 and forming an n-type electrode 40 over said exposing region 21*a* of said n-GaN based layer 21 are necessary. In fact, to completely form a marketed LED, some treatments on the LED 10 are also needed comprising wire bonding and packaging molded by such as epoxy (not shown). Since the wire bonding and packaging technology is well known to those persons skilled in the art, they are omitted in the detailed descriptions, for simplicity, of the inventive LED for both its device and method.

The following is dedicated to an inventive LED device according to the preferred embodiment of the present invention corresponding to the above preferred method embodiment. Referring to FIGS. 2 and 3, the LED device 10 includes a substrate 12, a multi-layer epitaxial structure 20, a Ni/Au ohmic contact layer 27, a light extraction layer 30, an n-type metal electrode 40 and a p-type metal electrode 50.

In the multi-layer epitaxial structure 20, a buffer layer 22, a first semiconductor layer 24, a light generation layer 26 and a second semiconductor layer 28 are comprised. The first semiconductor layer 24 corresponds to the MQW active layer 23, which may be such as a GaN MQW layer and an InGaN MQW layer. The second semiconductor layer 28 is a p-type GaN based III–V group compound semiconductor, which may be made such as of p-GaN, p-InGaN and p-AlInGaN.

The Ni/Au layer 27 is used as an ohmic contact layer since the contact characteristics of the doped ZnO based layer 30 and the p-GaN based layer 28 is not satisfactory.

The light extraction layer 30 is made of a doped metal oxide, which is light transmissible and formed over the second semiconductor layer 28. As an example and a preferred embodiment, the light extraction layer 30 is composed of a p-impurity doped ZnO based material and the p-impurity in a preferred embodiment is Al . The doped ZnO based light extraction layer 30 has better light transparency and the poorer conductive characteristics may be well compensated, by the Ni/Au layer 27. Therefore, the combination of the two layers 27 and 30 is a novel and excellent transparent contact layer (TCL).

Next, the n-type electrode 40 is disposed over an exposing region 24*a* of the first semiconductor layer 24 and the p-type electrode 50 over the light extraction layer 30. Therefore, the device of the inventive LED according to the preferred embodiment is achieved in good light extraction efficiency and ohmic contact layer.

Further, the doped ZnO based light extraction layer, 30 may obtain a roughened or particularly textured surface as mentioned above. With the improved doped ZnO light extraction layer 30, the light generated from the active layer 26 in the inventive LED is more penetrable through the layer 30 in the course of going out of the LED.

Further, because the light extraction layer 30 may be subject to a surface treatment to have the surface roughened and some form textured, the surface of the light extraction layer 30 may obtain more facets and thus the light extracted to a user's eyes may be increased. The illustrations for the particularly designed surface and its benefit to light extraction are given below.

Figure 4:
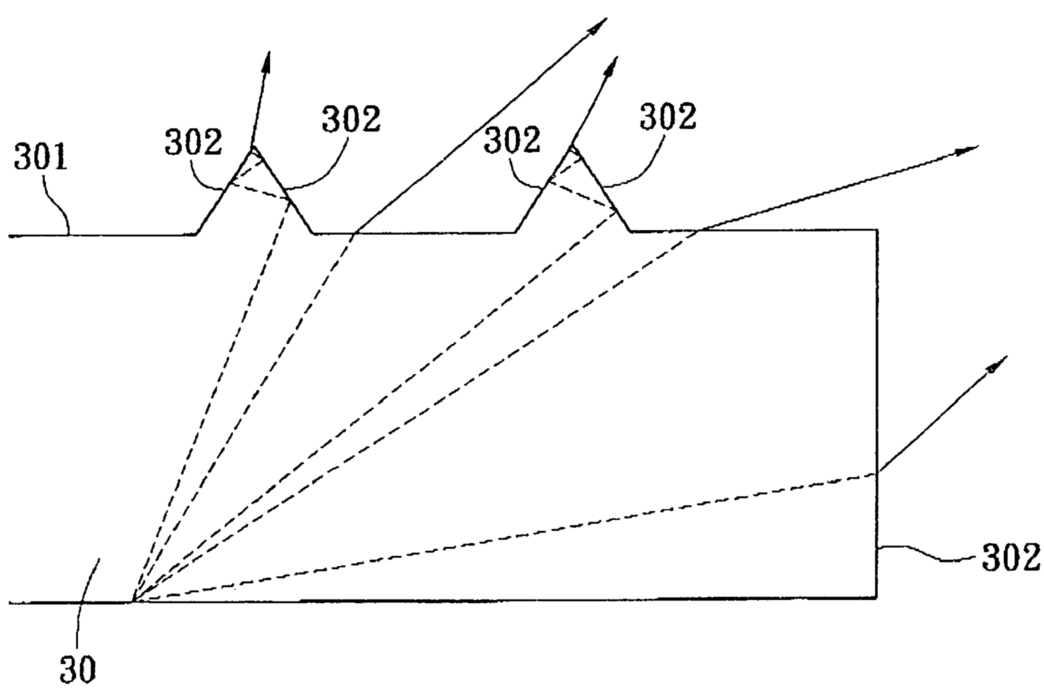
FIG. 4 depicts schematically light extraction of a light-emitting device.

As generally known, the light emitting from the LED device 10 may be led to total reflection and may not penetrate the device 10 to a user's eyes if the emitting angle of the generated light is smaller than a critical angle. Therefore, suitable thickness of light extraction layer is a favorable condition for light extraction. Owing to the light extraction layer 30 may be made bulky, i.e., 50 Å–50 μm, light extraction through use of the inventive LED 10 may be efficiently increased. Benefited from the bulky structure, the layer 30 may be disposed with a roughened surface 301 and thus has more facets 302 (shown in FIG. 4) thereon. As a consequence, the light extraction efficiency. may be facets enhanced.

Figure 5:
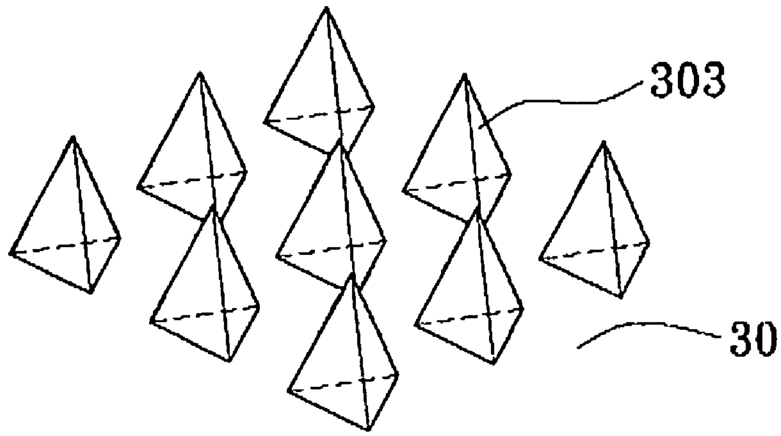
FIGS. 5 and 6 depict schematically a surface treatment of a light extraction layer.
Figure 6:
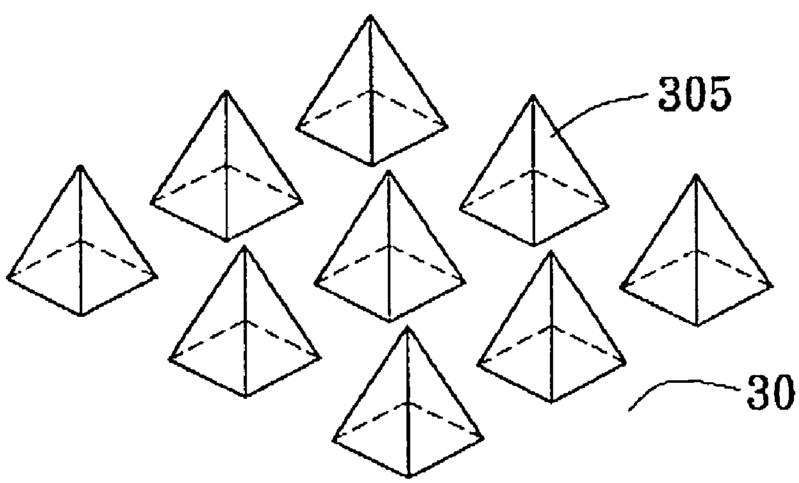

Referring to FIGS. 5 and 6, as also mentioned in the above, the surface of the light extraction 30 may be further applied with a surface treatment and then the facets on the surface may be further increased. In FIG. 5, the particularly textured surface 303 comprises a plurality of cones 303 comprising one with a circular bottom or a triangular bottom. In FIG. 6, the particularly textured surface 305 is a cone with a rectangular bottom (a pyramid). In fact, other geometrical cones may also be utilized herein to increase the number of the facets on the surface 303.

Figure 7:
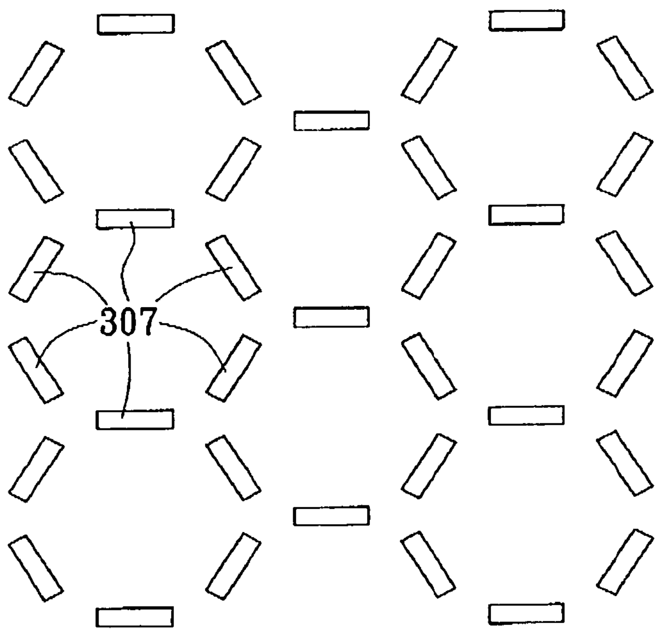
FIGS. 7 and 8 depict schematically a particularly textured area of another embodiment according to the present invention.
Figure 8:
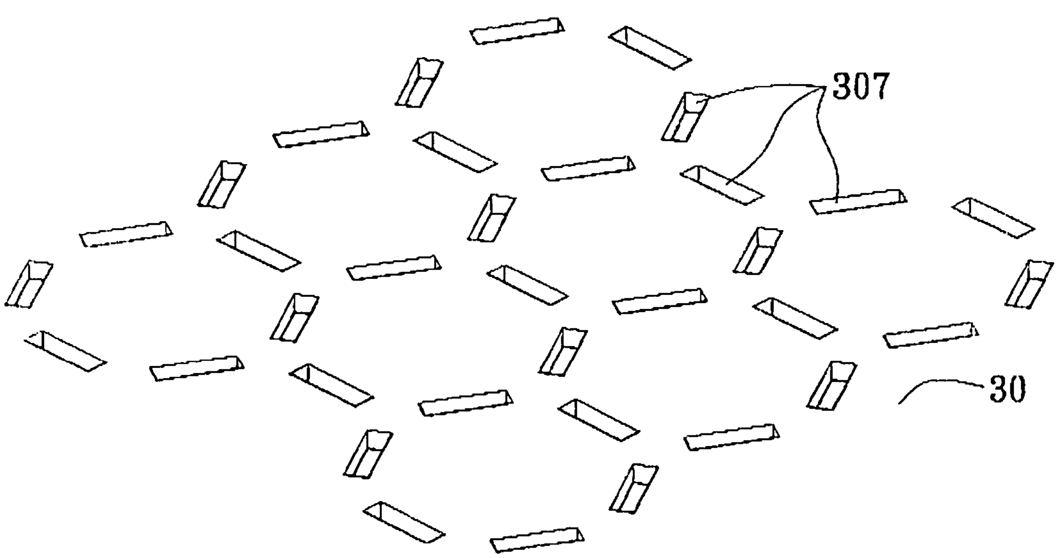

Referring to FIGS. 7 and 8. FIGS. 7 and 8 schematically depict a planar diagram and a partial perspective diagram of another embodiment of the particularly textured surface of the present invention. It can be seen the particularly textured surface may be further disposed with a plurality of recesses 307, and the recesses 307 may be in a triangular, rectangular, diamond or polygonal form, etc. Further, between recesses 307 are a suitable distance used as a current path for conduction purpose. Other geometrical arrangements may be allowed for the recesses 307.

Figure 9:
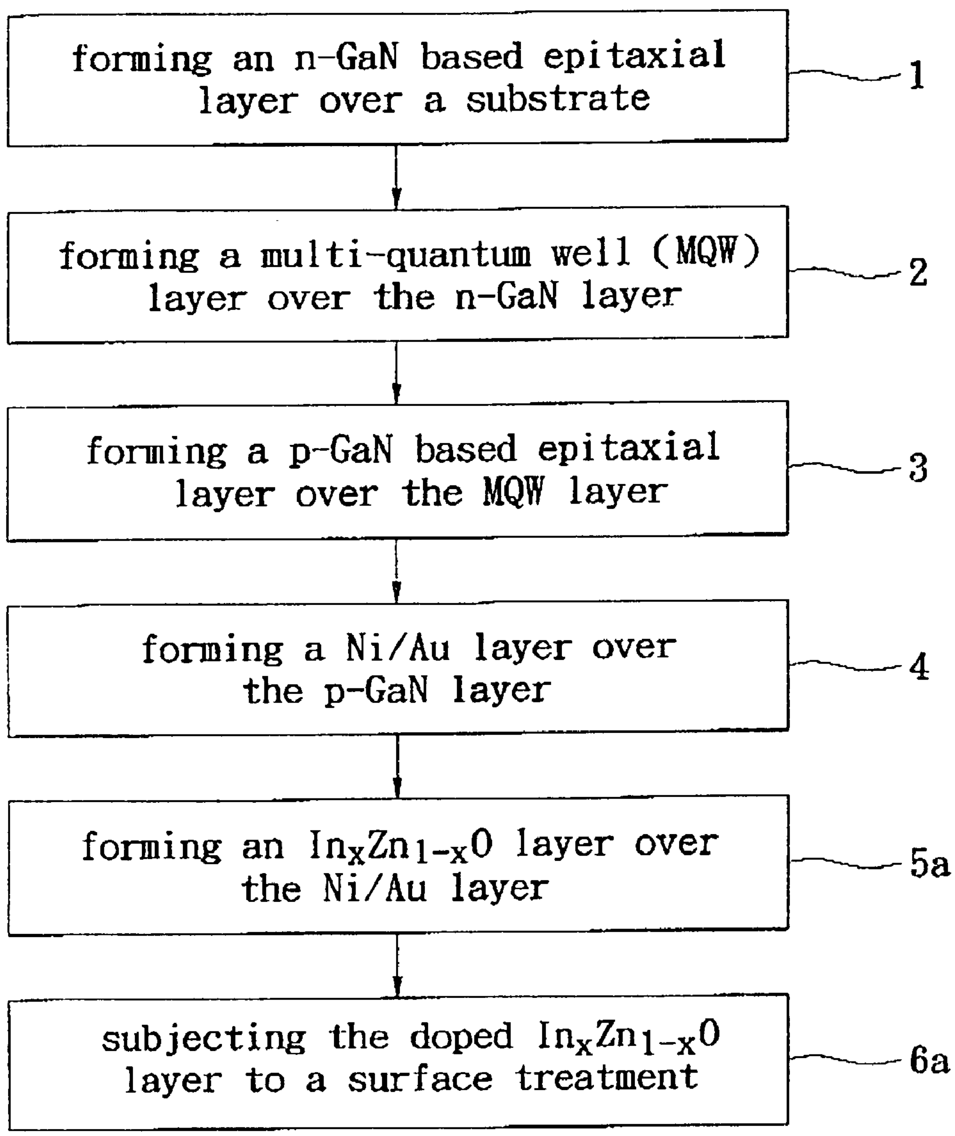
FIG. 9 depicts schematically a method of a second embodiment according to the present invention.
Figure 10:
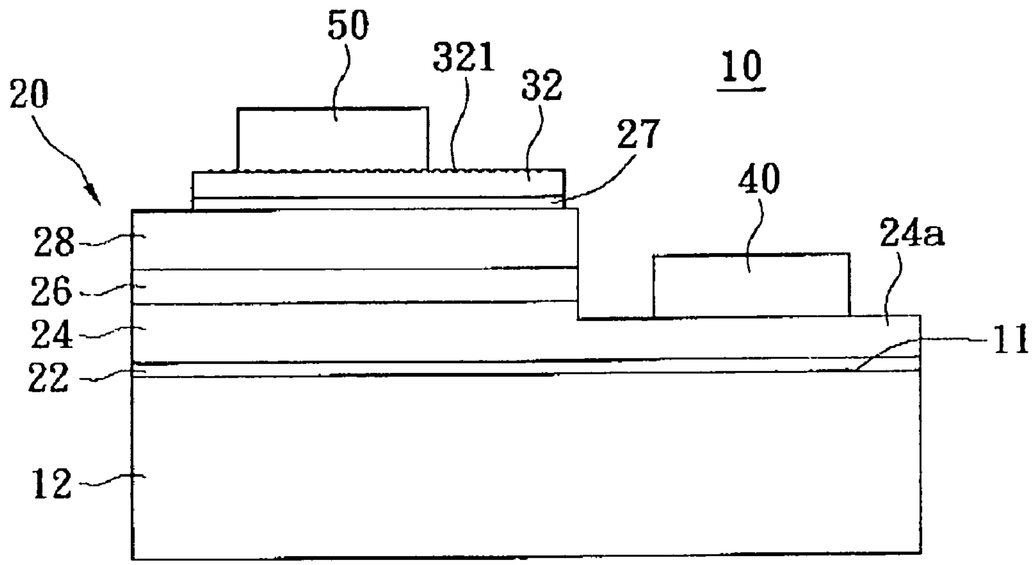
FIG. 10 depicts schematically a device of a second embodiment according to the present invention.

Referring to FIGS. 9 and 10, which illustrate a second embodiment of the present invention. In the embodiment, transparent doped $In_xZn_{1-x}O$ is used as the light extraction layer or window layer 32, wherein $0 \leqq X \leqq 1$. The steps used in this embodiment are generally similar to those in the preferred embodiment except for the steps, Steps 5*a* and 6*a*, which are different from Steps 5 and 6 of the preferred embodiment. In this embodiment, Step 5*a*: forming an doped $In_xZn_{1-x}O$ layer 32 over the Ni/Au layer 27. Similarly, the layer 27 serves as an ohmic contact layer and the layer 32 is preferably thicker than 1 μm. Step 6*a*: subjecting the doped $In_xZn_{1-x}O$ layer 32 to a surface treatment. When the thickness of the layer 32 is larger than 1 μm, the layer 32 may be formed through a surface treatment as a roughened surface 321 or particularly textured surface.

Figure 11:
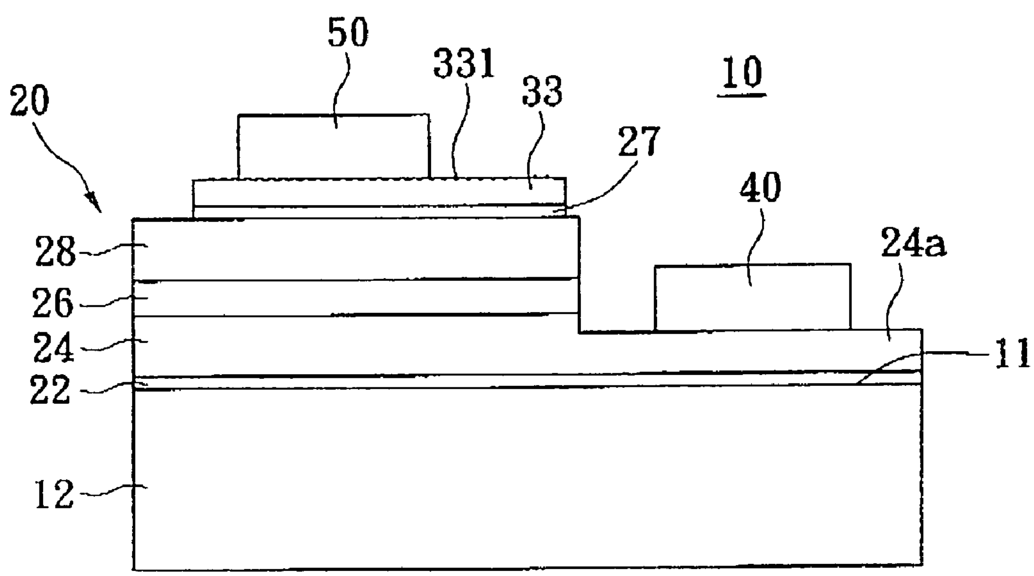
FIG. 11 depicts schematically a device of a third method embodiment according to the present invention.
Figure 12:
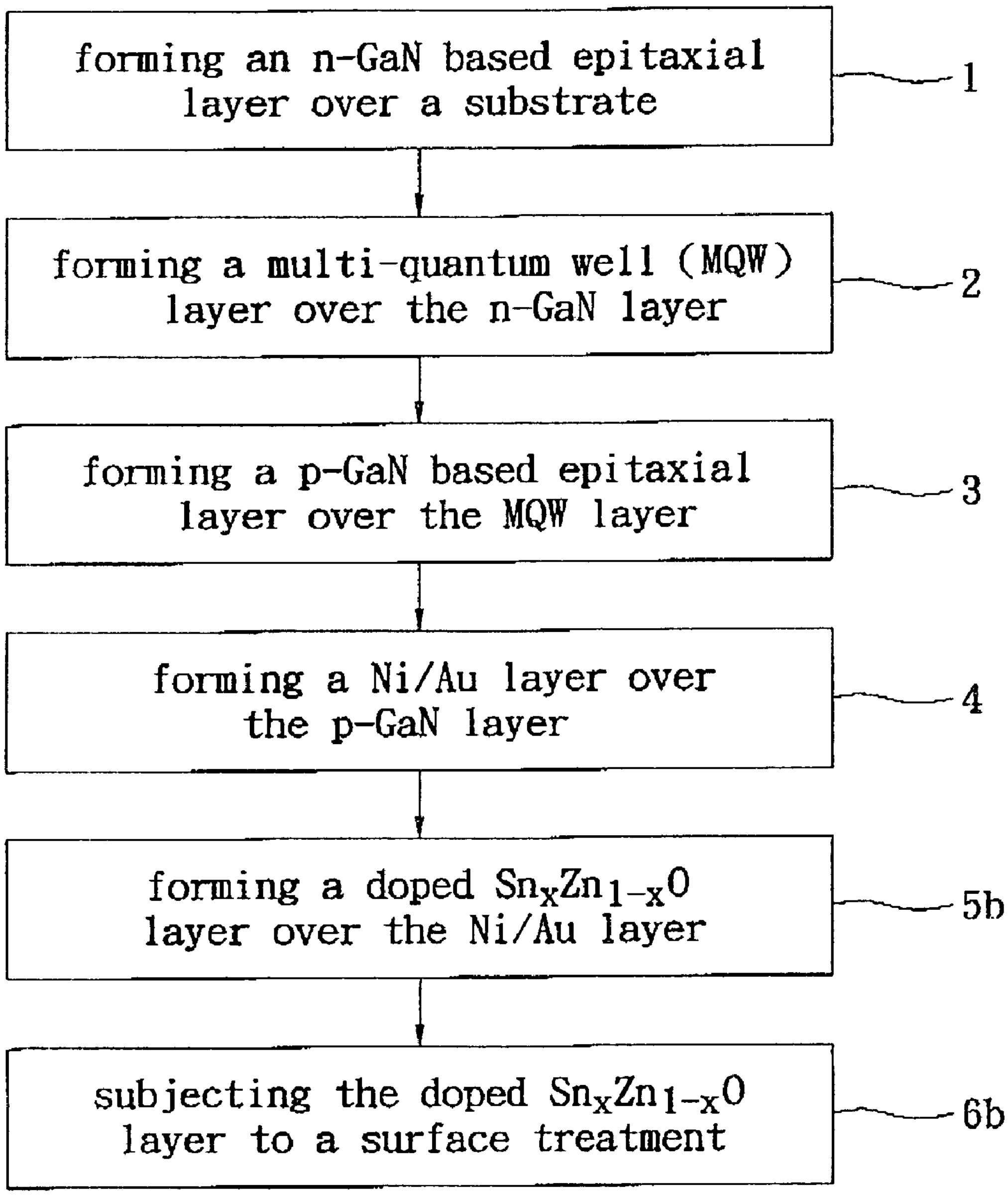
FIG. 12 depicts schematically a method of a third embodiment according to the present invention.

Referring to FIGS. 11 and 12, which illustrate a third embodiment of the present invention. In the embodiment, transparent doped $Sn_xZn_{1-x}O$ is used as the light extraction layer or window layer 33, wherein $0 \leqq X \leqq 1$. The steps used in this embodiment are generally similar to those in the preferred embodiment except for the steps, Steps 5*b* and 6*b*, which are different from Steps 5 and 6 of the preferred embodiment. In this embodiment, Step 5*b*: forming a doped $Sn_xZ_{1-x}O$ layer 33 over the Ni/Au layer 27. Similarly, the layer 27 serves as an ohmic contact layer and the layer 33 is preferably thicker than 1 μm. Step 6*b*: subjecting the doped $Sn_xZn_{1-x}O$ layer 33 to a surface treatment. When the thickness of the layer 33 is larger than 1 μm, the layer 33 may be formed though a surface treatment as a roughened surface 331 or particularly textured surface.

Figure 13:
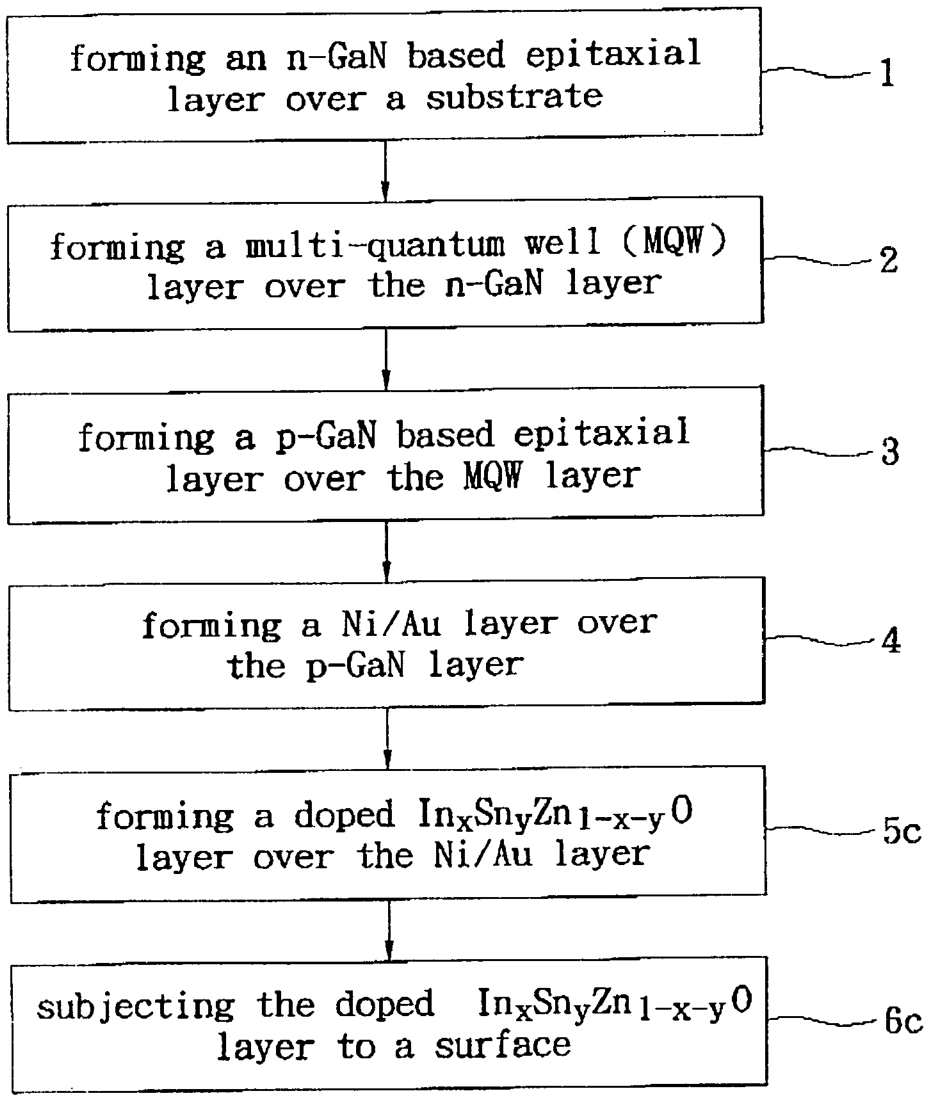
FIG. 13 depicts schematically a method of a fourth embodiment according to the present invention.
Figure 14:
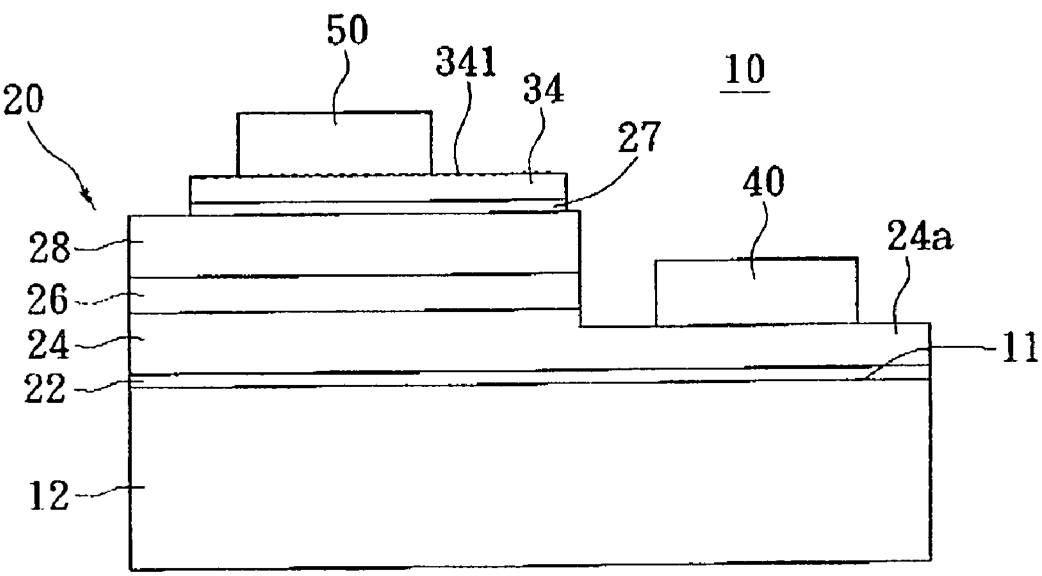
FIG. 14 depicts schematically a device of a fourth method embodiment according to the present invention.

Referring to FIGS. 13 and 14, which illustrate a fourth embodiment of the present invention. In the embodiment, a transparent doped $In_xSn_yZn_{1-y}O$ layer is used as the light extraction layer or window layer 34, wherein $0 \leqq X \leqq 1$, $0 \leqq Y \leqq 1$ and $0 \leqq X+Y \leqq 1$. The steps used in this embodiment are generally similar to those in the preferred embodiment except for the steps, Steps 5*c* and 6*c*, which are different from Steps 5 and 6 of the preferred embodiment. In this embodiment, Step 5*c*: forming a doped $In_xSn_yZn_{1-y}O$ layer 34 over the Ni/Au layer 27. Similarly, the layer 27 serves as an ohmic contact layer and the layer 34 is preferably thicker than 1 μm. Step 6*c*: subjecting the doped $In_xSn_yZn_{1-y}O$ layer 34 to a surface treatment. If the thickness of the layer 34 is made larger than 1 μm, the layer 34 may be formed through a surface treatment as a roughened surface 341 or particularly textured surface.

The dopants used in the doped metal oxide layer may at least be Al . Once the activation energy of the holes in this layer is overcome, all Group III-elements may be utilized. In addition to the illustrated doped metal oxides, other doped metal oxides may also be used,such as one having an index of refraction larger than 1.5, one doped with a rare earth element, or one being n-type or p-type semiconductor.

Similarly, in obtaining a marketable LED, a p-type electrode and an n-type electrode are necessary, and whose arrangements are similar to the corresponding one in the preferred embodiment. Packaging and wire bonding treatments are also needed.

The afro-mentioned is the preferred embodiment of the present invention, which may be easily modified by those persons skilled in the art. Hence, devices or methods deduced with reference to the disclosed one are deemed to fall within the spirit of the present invention. For example, although the detailed description of the LED and its manufacturing method of the present invention are limited to III–V group compound semiconductor based LED, the inventive doped metal oxide light extraction layer may be employed onto the II–VI group compound semiconductor based LED as long as the lattice matching issue with such LED may not be a problem.

If the exposing surface of the above mentioned structure is thin enough, the exposing surface can dope no Zno as well.

While the invention has been described by way of examples and in terms of preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A GaN based compound semiconductor light-emitting device (LED), comprising:

a substrate;

a multi-layer epitaxial structure comprising:

a buffer layer being an LT-GaN/HT-GaN layer formed over an upper surface of said substrate, wherein said LT-GaN is a low temperature layer first formed over said substrate, and said HT-GaN layer is a high temperature layer then formed over said LT-GaN layer;

a first semiconductor layer being an n-GaN based compound semiconductor layer formed over said buffer layer;

a light generating layer being a GaN based compound semiconductor active layer comprising a GaN multi-layer quantum well (MQW) layer; and a second semiconductor layer being a p-GaN based compound semiconductor formed over said light generating layer;

a Ni/Au layer formed over said second semiconductor layer;

a light extraction layer being a doped metal oxide transmissible to light and formed over said second semiconductor layer and comprising a III-group element doped ZnO based layer and having a thickness of at least 1 μm;

an n-type metal electrode disposed over an exposing region of said first semiconductor layer; and a p-type metal electrode disposed over said light extraction layer.

2. According to the LED in claim 1, wherein said substrate is at least made of sapphire or SiC and has a thickness of 300–450 μm, said LT-GaN has a thickness of 30–500 Å, said HT-GaN has a thickness of 0.5–6 μm, said first semiconductor has a thickness of 2–6 μm and said second semiconductor layer has a thickness of 0.2–0.5 μm, said second semiconductor layer is selected from a group consisting of a p-GaN, a p-InGaN and a p-AlInGaN epitaxial layers and said Ni/Au layer has a thickness of 0.005 to 0.2 μm.

3. According to the LED in claim 1, wherein said light generating layer further comprises an InGaN MQW active layer.

4. According to the LED in claim 1, wherein said light generating layer further comprises an AlGaInN based compound semiconductor epitaxial layer.

5. According to the LED in claim 1, wherein said doped ZnO based layer comprises a doped ZnO layer, a doped $In_xZn_{1-x}O$ layer, a doped $Sn_xZn_{1-x}O$ layer, wherein $0 \leqq X \leqq 1$, and a doped $In_xSn_yZn_{1-x-y}O$ layer, wherein $0 \leqq X \leqq 1$, $0 \leqq Y \leqq 1$ and $0 \leqq X+Y \leqq 1$.

6. According to the LED in claim 1, wherein said light extraction layer further comprises a doped metal oxide having an index of refraction of at least 1.5.

7. According to the LED in claim 1, wherein said light extraction layer is an n-dopant or p-dopant doped metal oxide.

8. According to the LED in claim 1, wherein said light extraction comprises a rare earth element doped metal oxide.

9. According to the LED in claim 1, wherein said light extraction layer comprises a doped metal oxide having a transmissible range for a light having a wavelength between 400 and 700 nm.

10. According to the LED in claim 1, light extraction layer further comprises a particularly textured surface having a plurality of cones with circular, triangular and rectangular bottoms or with any other geometrical bottom.

11. According to the LED in claim 1, wherein said light extraction layer further comprises a particularly textured surface having a plurality of recesses, wherein said recesses are arranged in polygonal or any other geometrical form with a suitable distance from each other as a current path for conduction.

12. According to the LED in claim 11, wherein each of said plurality of recesses has a suitable distance with an adjacent recess of said plurality of recesses as a conductive path and arranged in a particular form selected from a group consisting of triangular, rectangular, polygonal, diamond and any other geometrical forms.

* * * * *